(12) United States Patent
Ohno et al.

(10) Patent No.: US 10,763,395 B2
(45) Date of Patent: Sep. 1, 2020

(54) LIGHT EMITTING DIODE ELEMENT AND METHOD FOR MANUFACTURING SAME

(71) Applicant: Panasonic Intellectual Property Management Co., Ltd., Osaka (JP)

(72) Inventors: Hiroshi Ohno, Osaka (JP); Kenya Yamashita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/295,115

(22) Filed: Mar. 7, 2019

(65) Prior Publication Data

US 2019/0348569 A1 Nov. 14, 2019

(30) Foreign Application Priority Data

May 11, 2018 (JP) .................................. 2018-092360

(51) Int. Cl.
*H01L 33/22* (2010.01)
*H01L 33/00* (2010.01)
*H01L 33/32* (2010.01)

(52) U.S. Cl.
CPC .......... *H01L 33/22* (2013.01); *H01L 33/0075* (2013.01); *H01L 33/325* (2013.01)

(58) Field of Classification Search
CPC ... H01L 33/22; H01L 33/0075; H01L 33/325; H01L 33/14; H01L 33/025; H01L 33/007;

(Continued)

(56) References Cited

U.S. PATENT DOCUMENTS

2001/0015442 A1 8/2001 Kondoh et al.
2002/0109146 A1 8/2002 Yamada
(Continued)

FOREIGN PATENT DOCUMENTS

JP 2002-231997 A 8/2002
JP 2002-373864 A 12/2002
(Continued)

OTHER PUBLICATIONS

The Extended European Search Report dated Sep. 9, 2019 for the related European Patent Application No. 19163745.3.

*Primary Examiner* — Galina G Yushina
(74) *Attorney, Agent, or Firm* — McDermott Will & Emery LLP

(57) ABSTRACT

A flip-chip light emitting diode element capable of reducing lateral resistance. The flip-chip light emitting diode element includes a stacked body structure configured by sequentially stacking a first n-type group III nitride semiconductor layer having a carrier concentration that is at least $1\times10^{19}$ cm$^{-3}$ but less than $3\times10^{20}$ cm$^{-3}$, a second n-type group III nitride semiconductor layer having a carrier concentration that is at least $5\times10^{17}$ cm$^{-3}$ but less than $1\times10^{19}$ cm$^{-3}$, a light-emitting layer formed by a group III nitride semiconductor, and a p-type group III nitride semiconductor layer. A height of unevenness on an interface between the first n-type group III nitride semiconductor layer and the second n-type group III nitride semiconductor layer is greater than that of unevenness of an interface between the second n-type group III nitride semiconductor layer and the light emitting layer.

11 Claims, 9 Drawing Sheets

(58) Field of Classification Search
CPC ......... H01L 33/32; H01L 33/18; H01L 33/16; C30B 25/00; C30B 25/04; C30B 25/18
See application file for complete search history.

(56) References Cited

U.S. PATENT DOCUMENTS

| | | |
|---|---|---|
| 2002/0189532 A1 | 12/2002 | Motoki et al. |
| 2005/0179051 A1 | 8/2005 | Kondoh et al. |
| 2011/0024722 A1* | 2/2011 | Moustakas ........ H01L 21/02389 257/13 |
| 2012/0001223 A1* | 1/2012 | Inoue ....................... H01L 33/14 257/103 |
| 2012/0112159 A1 | 5/2012 | Komada |
| 2012/0112188 A1* | 5/2012 | Yokoyama .......... H01L 21/0242 257/51 |
| 2012/0187370 A1* | 7/2012 | Jeong ....................... H01L 33/14 257/13 |
| 2017/0373218 A1* | 12/2017 | Nagata .................. H01L 33/007 |

FOREIGN PATENT DOCUMENTS

| | | |
|---|---|---|
| JP | 2006-120856 A | 5/2006 |
| JP | 4118370 B | 7/2008 |
| JP | 2010-030877 A | 2/2010 |
| JP | 2012-104528 A | 5/2012 |
| JP | 2013-212941 A | 10/2013 |
| JP | 2013-230971 A | 11/2013 |
| JP | 2017-228695 A | 12/2017 |
| KR | 2012136703 A | 12/2012 |
| KR | 2013061306 A | 6/2013 |

\* cited by examiner

501

502

LIGHT EMITTING DIODE ELEMENT AND METHOD FOR MANUFACTURING SAME

TECHNICAL FIELD

The technical field relates to a light emitting diode element and a method for manufacturing a light emitting diode element.

BACKGROUND

A group III nitride-based compound semiconductor typified by gallium nitride (GaN), that is, a so-called nitride semiconductor has attracted attention as a material for new devices such as a light emitting diode (LED), a laser diode (LD) and a power device. The nitride semiconductor is a compound semiconductor formed of indium (In), gallium (Ga), and aluminum (Al), which are group III elements, and of nitrogen (N) which is a group V element. A general formula of the compound semiconductors is represented by $In_xGa_yAl_{1-x-y-z}N$ ($0 \leq x \leq 1$, $0 \leq y \leq 1$, $x+y \leq 1$).

Although heterogeneous substrates such as sapphire or Si are commonly used as a substrate for forming a group III nitride semiconductor device, a group III nitride semiconductor thin film formed on these substrates has a high dislocation density and cannot exhibit the original physical potential of the nitride semiconductor. Although a GaN substrate, which has a lower dislocation density than that of the heterogeneous substrate, has been commercialized, the dislocation density and the variation in crystal orientation of the substrate are still large. In addition, the GaN substrate is expensive.

Currently, a nitride-based LED mainly uses a sapphire substrate or a GaN substrate as an under-substrate. Since a Si substrate does not allow the transmission of an emission wavelength of the LED, the Si substrate is hardly used for LED applications. In the case of the sapphire substrate that is the most commonly used, since the substrate is insulative and the thermal conductivity thereof is not high, it is common to adopt a flip-chip structure in which a p-side ohmic electrode and an n-side ohmic electrode are formed on one side surface (for example, see Japanese Patent No. 4118370 (Patent Document 1)).

However, there is also a problem in a flip-chip light emitting diode element having a configuration in the related art. In this type of light emitting diode element, when the light-emitting diode element is operated, an operating current flows through an n-GaN layer in a lateral direction (representing a direction orthogonal to a stacking direction of the layers as applied below). Therefore, in this type of light emitting diode element, a relatively large series resistance (hereinafter, also referred to as "lateral resistance") based on the resistivity of the n-GaN layer is added when the operating current flows through. As a result, an operating voltage may be increased.

The present disclosure is made to solve the above problems, and an object thereof is to provide a flip-chip light emitting diode element capable of reducing lateral resistance and a method for manufacturing the light emitting diode element.

SUMMARY

In order to solve the above problems, an aspect of the disclosure provides a light emitting diode element of a flip-chip type, which includes:

a stacked body structure configured by stacking the following layers sequentially:

a first n-type group III nitride semiconductor layer having a carrier concentration that is at least $1 \times 10^{19}$ cm$^{3}$ but less than $3 \times 10^{20}$ cm$^{-3}$;

a second n-type group III nitride semiconductor layer having a carrier concentration that is at least $5 \times 10^{17}$ cm$^{-3}$ but less than $1 \times 10^{19}$ cm$^{-3}$;

a light emitting layer formed by a group III nitride semiconductor; and a p-type group III nitride semiconductor layer, in which a height of unevenness on an interface between the first n-type group III nitride semiconductor layer and the second n-type group III nitride semiconductor layer is greater than a height of unevenness on an interface between the second n-type group III nitride semiconductor layer and the light emitting layer.

According to the light emitting diode element of the disclosure, the lateral resistance can be greatly reduced and a more efficient LED with a low operating voltage can be achieved.

DETAILED DESCRIPTION OF PREFERRED EMBODIMENTS

Hereinafter, illustrative embodiments of the disclosure will be described with reference to the drawings.

[Configuration of Light Emitting Diode Element]

Figure 1:
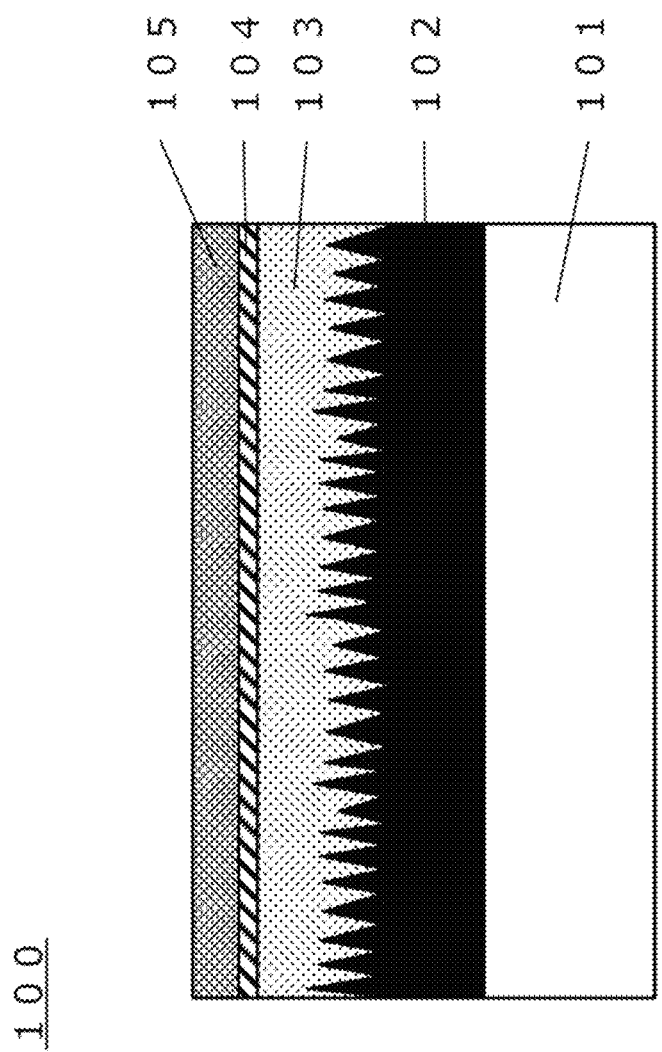
FIG. 1 is a diagram showing a stacked body structure that configures a light emitting diode element according to an illustrative embodiment of the disclosure.

FIG. 1 is a diagram showing a stacked body structure (hereinafter, also referred to as "LED structure") 100 that configures a light emitting diode element according to one illustrative embodiment.

In FIG. 1, 101 denotes an under-substrate (heterogeneous material substrate) formed of a material different from group III nitride, 102 denotes a first n-type group III nitride semiconductor layer, 103 denotes a second n-type group III nitride semiconductor layer, 104 denotes a light emitting layer, and 105 denotes a p-type group III nitride semiconductor layer.

The LED structure 100 according to the present illustrative embodiment is configured by sequentially stacking the first n-type group III nitride semiconductor layer 102, the second n-type group III nitride semiconductor layer 103, the light emitting layer 104, and the p-type group III nitride semiconductor layer 105 on the under-substrate 101.

A "group III nitride semiconductor" refers to a structure body formed of at least one of GaN, AlN, and InN, or a mixture thereof.

The under-substrate 101 is a nitride semiconductor seed substrate, for example, a sapphire substrate is used. However, an oxide transparent substrate such as, for example, SiC, ZnO, $Ga_2O_3$, or $ScAlMgO_4$, which has translucency for light from the light emitting layer 104 can also be used as the under-substrate 101.

Furthermore, in a case where GaN is used as a group III nitride semiconductor, $ScAlMgO_4$ is suitable as the under-substrate 101. Since $ScAlMgO_4$ has a small lattice mismatch (represented by (GaN lattice constant—$ScAlMgO_4$ lattice constant)/GaN lattice constant×100%) of −1.5% with GaN, high-quality GaN with fewer defects can be formed. In this case, instead of $ScAlMgO_4$, a $RAMO_4$ substrate may be used as the under-substrate 101. The $RAMO_4$ substrate is formed of a monocrystal represented by a general formula $RAMO_4$ (Here, in the general formula, R represents one or a plurality of trivalent elements selected from the group including: Sc, In, Y and lanthanoide elements; A represents one or a plurality of trivalent elements selected from the group including: Fe(III), Ga and Al; and M represents one or a plurality of divalent elements selected from the group including: Mg, Mn, Fe(II), Co, Cu, Zn and Cd).

The first n-type group III nitride semiconductor layer 102 is an n-type group III nitride semiconductor layer having a carrier concentration that is at least equal to $1\times10^{19}$ $cm^{-3}$ but less than $3\times10^{20}$ $cm^{-3}$. N-type GaN is used as the first n-type group III nitride semiconductor layer 102 (hereinafter, also referred to as a "first n-type GaN layer 102") according to the present illustrative embodiment.

The second n-type group III nitride semiconductor layer 103 is an n-type group III nitride semiconductor layer having a carrier concentration that is at least equal to $5\times10^{17}$ $cm^{-3}$ but less than $1\times10^{19}$ $cm^{-3}$, which is lower than that of the first n-type group III nitride semiconductor layer 102. N-type GaN is used as the second n-type group III nitride semiconductor layer 103 (hereinafter, also referred to as a "second n-type GaN layer 103") according to the present illustrative embodiment.

The light emitting layer 104 is formed of a group III nitride semiconductor having a band gap that is smaller than that of the second n-type group III nitride semiconductor layer 103. The light emitting layer 104 may be a single-layered bulk layer or a multi-layered structure such as, for example, a quantum well structure. An InGaN layer is used as the light emitting layer 104 according to the present illustrative embodiment.

Furthermore, the first n-type group III nitride semiconductor layer 102 and the second n-type group III nitride semiconductor layer 103 are subjected to crystal growth under different growth conditions (details will be described below). Accordingly, a height of unevenness on an interface between the first n-type group III nitride semiconductor layer 102 and the second n-type group III nitride semiconductor layer 103 is greater than a height of unevenness on an interface between the second n-type group III nitride semiconductor layer 103 and the light emitting layer 104.

The p-type group III nitride semiconductor layer 105 is formed by a p-type group III nitride semiconductor having a band gap larger than that of the light emitting layer 104. P-type GaN is used as the p-type group III nitride semiconductor layer 105 (hereinafter, also referred to as "p-type GaN layer 105") according to the present illustrative embodiment.

Further, in the LED structure 100, an undoped group III nitride semiconductor layer (not shown) may be inserted as a connection layer between the second n-type group III nitride semiconductor layer 103 and the light emitting layer 104. A high concentration p-type group III nitride semiconductor layer (for example, a p+GaN layer doped with Mg in $1\times10^{20}$ $cm^{-3}$, not shown) may be stacked as a contact layer on a surface of the p-type group III nitride semiconductor layer 105.

Figure 2:
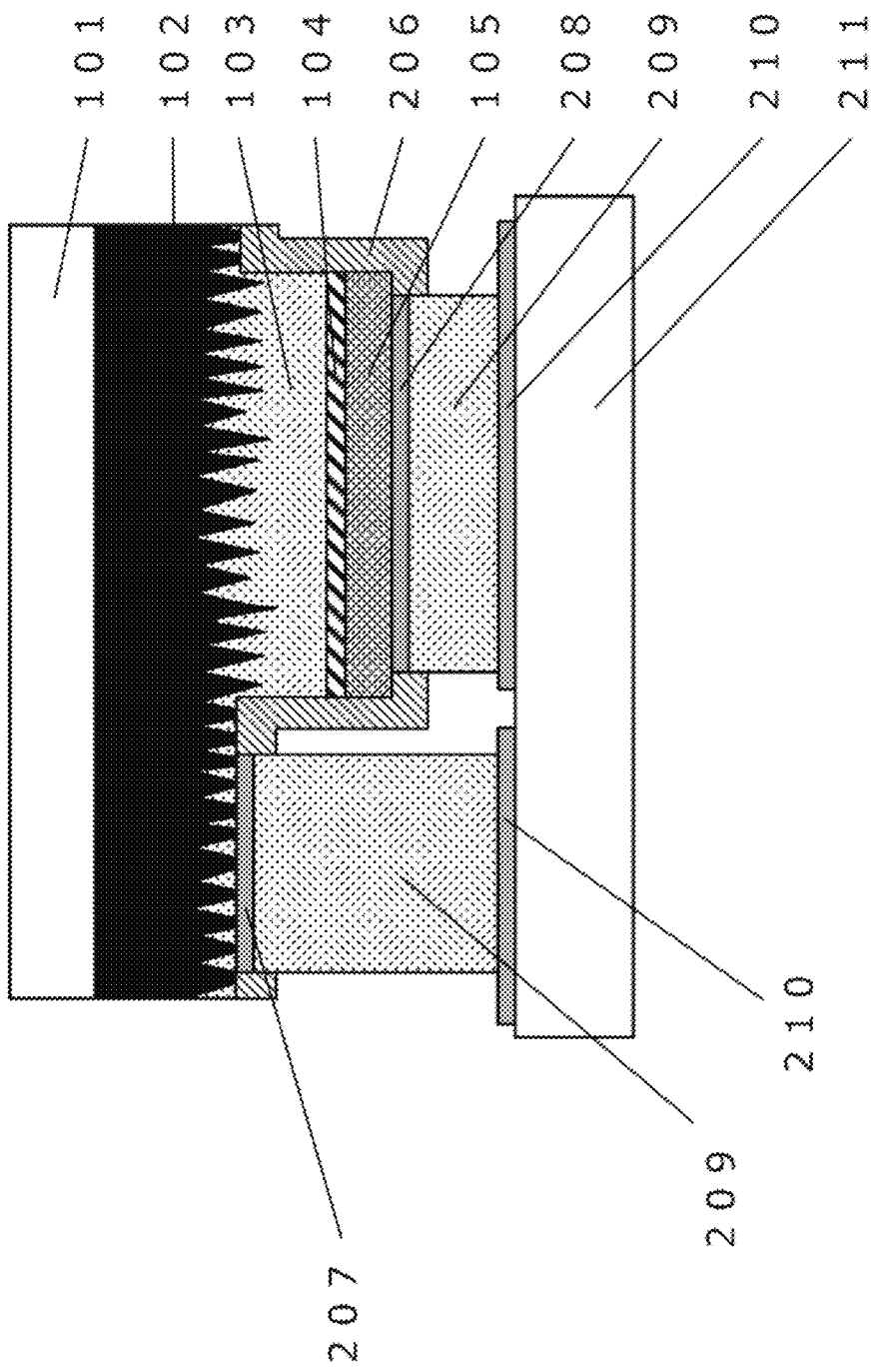
FIG. 2 is a diagram showing an overall configuration of a flip-chip light emitting diode element according to the illustrative embodiment of the disclosure.

FIG. 2 is a diagram showing an overall configuration of a flip-chip light emitting diode element 200 according to the present illustrative embodiment.

In FIG. 2, 206 denotes a protective film formed of an insulation film, 207 denotes an n-side ohmic electrode, 208 denotes a p-side ohmic electrode, 209 denotes a pad electrode, 210 denotes a sub-mount side electrode, and 211 denotes a sub-mount substrate.

The n-side ohmic electrode 207 and the p-side ohmic electrode 208 are disposed on the same side of the LED structure 100.

The n-side ohmic electrode 207 is in ohmic contact with at least one of the first n-type group III nitride semiconductor layer 102 and the second n-type group III nitride semiconductor layer 103. In the present illustrative embodiment, a contact surface between the n-side ohmic electrode 207 and the LED structure 100 is located in a region of the interface between the first n-type group III nitride semiconductor layer 102 and the second n-type group III nitride semiconductor layer 103, and the n-side ohmic electrode 207 is configured to be in ohmic contact with both the first n-type group III nitride semiconductor layer 102 and the second n-type group III nitride semiconductor layer 103.

The p-side ohmic electrode 208 is in ohmic contact with the p-type group III nitride semiconductor layer 105.

[Step of Manufacturing Light Emitting Diode Element] (Crystal Growth Step)

Next, crystal growth steps for forming the LED structure 100 will be described in detail with reference to FIGS. 1, 3, and 4.

Figure 3:
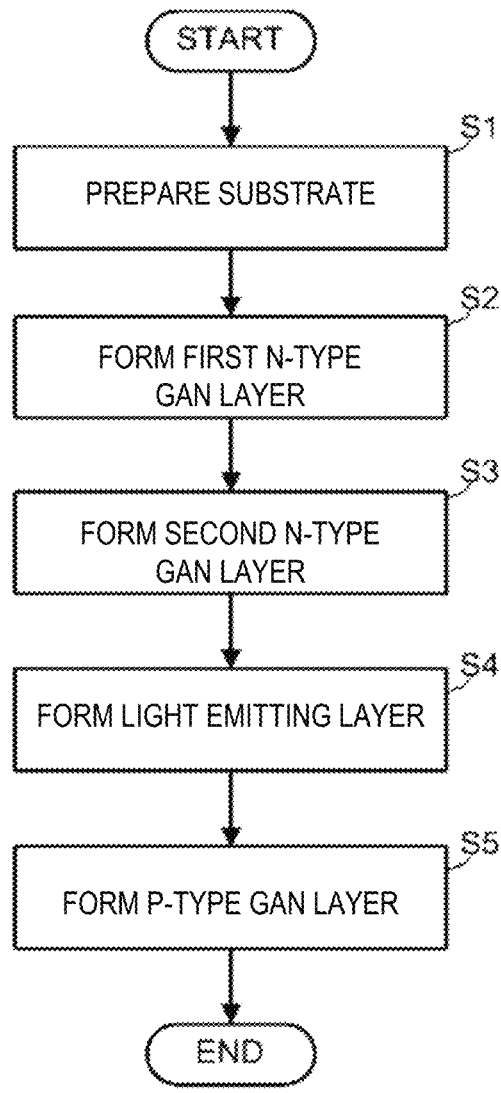
FIG. 3 is a flow chart showing steps of forming an LED structure according to the illustrative embodiment of the disclosure.

FIG. 3 is a flowchart showing steps of forming the LED structure 100.

First, a sapphire substrate in which a (0001) plane is a main plane is prepared as the under-substrate 101 (step S1). An off-angle substrate whose main surface is inclined by about 0° to 5° with respect to the (0001) plane may be used as the sapphire substrate.

Next, the first n-type GaN layer 102 is formed on the under-substrate 101 (step S2).

Vapor Phase Epitaxy methods such as a Hydride Vapor Phase Epitaxy (HVPE) method or an Oxide Vapor Phase Epitaxy (OVPE) method can be used as a crystal growth method of GaN in step S2. The HVPE method is used for growth in the present illustrative embodiment.

Here, GaCl obtained by reacting metal gallium (Ga) with hydrogen chloride (HCl) gas is used as a group III raw material. Moreover, ammonia gas ($NH_3$) is used as a group V raw material, and hydrogen ($H_2$) and nitrogen ($N_2$) are used as carrier gases. Oxygen ($O_2$) gas or dichlorosilane ($SiH_2Cl_2$) is used as an n-type donor impurity raw material.

In step S2, the under-substrate 101 introduced into a HVPE furnace is first thermally cleaned in a hydrogen atmosphere at about 500° C. for 30 minutes. As a result, carbon-based soiling or the like that adheres to a surface of the under-substrate 101 is removed. Then, an amorphous low-temperature buffer layer (not shown) is deposited about 50 nm on the under-substrate 101 at 500° C. The film thickness of the buffer layer can be adjusted by growth time, growth temperature, and a ratio of group III raw materials to be supplied. After the growth of the buffer layer, the substrate temperature is raised to about 1000° C., and the buffer layer is recrystallized to form crystal nuclei for the growth. Then, the first n-type GaN layer 102 is stacked at 1000° C. to 1100° C.

When the first n-type GaN layer 102 is grown from the buffer layer, the growth conditions are appropriately adjusted such that the surface of the first n-type GaN layer 102 is subjected to three-dimensional growth with large unevenness (also referred to as facet growth). An adjustment condition is a growth condition to stabilize crystal growth by growing while forming an inclined plane (facet plane) other than the main plane (0001), and can be adjusted so as to generate facet growth by changing growth temperature, a growth rate, a V/III ratio (ratio of group V raw material to group III raw material) or the like. In general, it is easy to achieve facet growth by maintaining growth conditions as low growth temperature, high growth rate, and high V/III ratio. The present illustrative embodiment adopted the conditions in which the growth temperature is 1000° C., the growth rate is 200 μm/h, and the V/III ratio is 100. The unevenness growth on the first n-type GaN layer 102 may be improved by forming unevenness structures in advance on the surface of the under-substrate 101.

The facet growth has a feature that the GaN layer can increase an efficiency of incorporating dopant impurities. In the normal flat growth (c-plane growth), crystallinity is likely to decrease when a dopant impurity (for example, Si) is doped in the GaN layer with $10^{18}$ $cm^{-3}$ or higher, for example. From this point of view, as a result of the study by the inventors of the present application, it was clear that in the case of facet growth, more dopant impurities, for example, equal to or greater than $1\times10^{19}$ $cm^{-3}$, can be doped in the GaN layer without decreasing the crystallinity of the GaN layer. In particular, in a case where oxygen (O) that is a light element is used as a donor impurity, the impurity concentration can be even higher.

In the present illustrative embodiment, the growth conditions are adjusted such that the first n-type GaN layer 102 is configured to have an average thickness of 30 μm and a height of unevenness of about 5 μm.

The thickness of the first n-type GaN layer 102 is preferably at least equal to 10 μm but no greater than 100 μm, and is more preferably at least equal to 30 μm but no greater than 80 μm. With such a thickness, it is possible to obtain an n-type layer having a sufficiently low resistance than an LED structure (the thickness of an n-type layer in an LED structure of the related art is about 10 μm) formed only by MOCVD of the related art. In addition, it is possible to obtain an n-type layer having a low resistance similar to, or superior to, that in the case of using a commercially available conductive GaN substrate.

The height of unevenness of the first n-type GaN layer 102 is preferably at least equal to 1 μm but no greater than 10 μm. The height of unevenness mentioned here refers to the height (for example, a PV value) of unevenness in each facet growth region. In the case of the facet growth, a size ratio of one facet growth region to the height thereof is usually close to 1:1. However, it is difficult to maintain the facet if the height of unevenness of each growth region is less than 1 μm. The facet growth may be changed to the non-facet growth (that is, growth with priority in the lateral direction) due to slight fluctuations in the growth conditions or the like. On the other hand, if each facet is made larger than 10 μm, the unevenness also become large, but it is difficult to flatten the second n-type GaN layer 103 subsequent to the first n-type GaN layer 102 during stacking.

For example, the first n-type GaN layer 102 is doped with oxygen (O) as an n-type impurity in a concentration of $2\times10^{19}$ $cm^{-3}$. As an n-type impurity to be doped, silicon (Si) may be added by using dichlorosilane ($SiH_2Cl_2$), but deterioration of crystallinity may be observed in a concentration equal to or greater than $5\times10^{18}$ $cm^{-3}$ if Si is doped. Therefore, it is considered that oxygen (O) is more suitable when doping the n-type impurity in a high concentration. As described above, by forming the first n-type GaN layer 102 using the facet growth, doping at $1\times10^{19}$ $cm^{-3}$ or higher can be performed without deteriorating the crystal quality no matter which one of oxygen (O) and silicon (Si) is doped.

A facet plane generated during the formation of the first n-type GaN layer 102 can be easily generated as long as the facet plane is (11-22) or (1-102). However, since an effect of increasing the impurity incorporation is also observed in other high-order facet planes, these facet planes may also be used. In addition, unification of the facet plane is not particularly required.

Next, the second n-type GaN layer 103 is formed on the first n-type GaN layer 102 (step S3).

Similarly to the first n-type GaN layer 102, the second n-type GaN layer 103 according to the present illustrative embodiment is formed by using the HVPE method.

In step S3, however, the second n-type GaN layer 103 is grown such that unevenness on the surface of the first n-type GaN layer 102 is gradually reduced, that is, the surface of the second n-type GaN layer 103 is flat (also referred to as the flat growth). Furthermore, the flat growth is non-facet growth. The height of unevenness on the surface after the second n-type GaN layer 103 is formed is no greater than 500 nm, and more preferably no greater than 100 nm. In particular, a configuration in which the height of unevenness on the interface between the second n-type group III nitride semiconductor layer 103 and the light emitting layer 104 is less than 100 nm in a region of 10 $μm^2$ in a plan view is preferable in terms of improving the quality of the light emitting layer 104.

As described above, in the group III nitride semiconductor layer, a growth mode can be adjusted by changing the growth temperature, the growth rate, the V/III ratio (the ratio of the group V raw material to the group III raw material), or the like. In general, it is easy to achieve the flat growth by maintaining the growth conditions as high growth temperature, low growth rate, and low V/III ratio. In the present illustrative embodiment, the second n-type GaN layer 103 was grown under conditions in which the growth temperature is 1000° C., the growth rate is 100 μm/h, and the V/III ratio is 20. Silicon (Si) was doped into the second n-type semiconductor layer as an n-type donor impurity in $1\times10^{18}$ $cm^{-3}$. However, oxygen (O) may be used as an n-type impurity.

The second n-type GaN layer 103 has a function of flattening an under-layer on which the light emitting layer 104 is to be formed in the next step. In a case where the second n-type GaN layer 103 is subjected to the facet growth, a wavelength distribution associated with the facet plane of the second n-type GaN layer 103 is generated in radiation light radiated from the light emitting layer 104 to be formed in the next step, which causes that the radiation light radiated from the light emitting layer 104 cannot be have a single wavelength (a wavelength spectrum of the single wavelength here generally refers to an emission spectrum of a single peak of an LED, rather than a completely single wavelength spectrum such as a laser). This is because in the light emitting layer 104, the incorporation amount of In or other impurities among InGaN layers, which are the material of the light emitting layer 104, varies due to the plane orientation of the facet plane of the second n-type GaN layer 103.

Due to the above reasons, it is very important to flatten the surface of the second n-type GaN layer 103.

Furthermore, in a case where a multi-element material such as AlGaN, AlInN or AlInGaN, or a material such as GaN or AlN is used as the light emitting layer 104 instead of InGaN, it is also effective to flatten the surface of the under-second n-type GaN layer 103. This is because, in a case where the light emitting layer 104 is formed by these materials, the incorporation efficiency of the group III elements or the impurity in the light emitting layer 104 also varies due to the plane orientation of the facet plane of the under-second n-type GaN layer 103 similarly.

Next, the light emitting layer 104 is formed on the second n-type GaN layer 103 (step S4).

In the present illustrative embodiment, the light emitting layer 104 is formed by a Metal Organic Chemical Vapor Deposition (MOCVD) method. Trimethylgallium (TMG), trimethylindium (TMI), trimethylaluminum (TMA) or the like is used as a group III material, and ammonia gas (NH$_3$) is used as a group V material. Hydrogen (H$_2$) or nitrogen (N$_2$) is used as carrier gas. In addition, biscyclopentadienyl magnesium (Cp$_2$Mg) is used as a p-type acceptor impurity. The light emitting layer 104 according to the present illustrative embodiment is formed to have a quantum well structure containing InGaN, for example.

Finally, the p-type GaN layer 105 is formed on the light emitting layer 104 (step S5).

In the present illustrative embodiment, similarly to the light emitting layer 104, the p-type GaN layer 105 is formed by using the MOCVD method. For example, the p-type GaN layer 105 is formed by doping magnesium (Mg) into a GaN layer with $1\times10^{19}$ cm$^{-3}$ when forming the GaN layer.

In this manner, the P-N junction type LED structure 100 is formed.

Here, the carrier concentration of the first n-type GaN layer 102 is preferably at least equal to $1\times10^{19}$ cm$^{-3}$ but less than $3\times10^{20}$ cm$^{-3}$.

Figure 4:
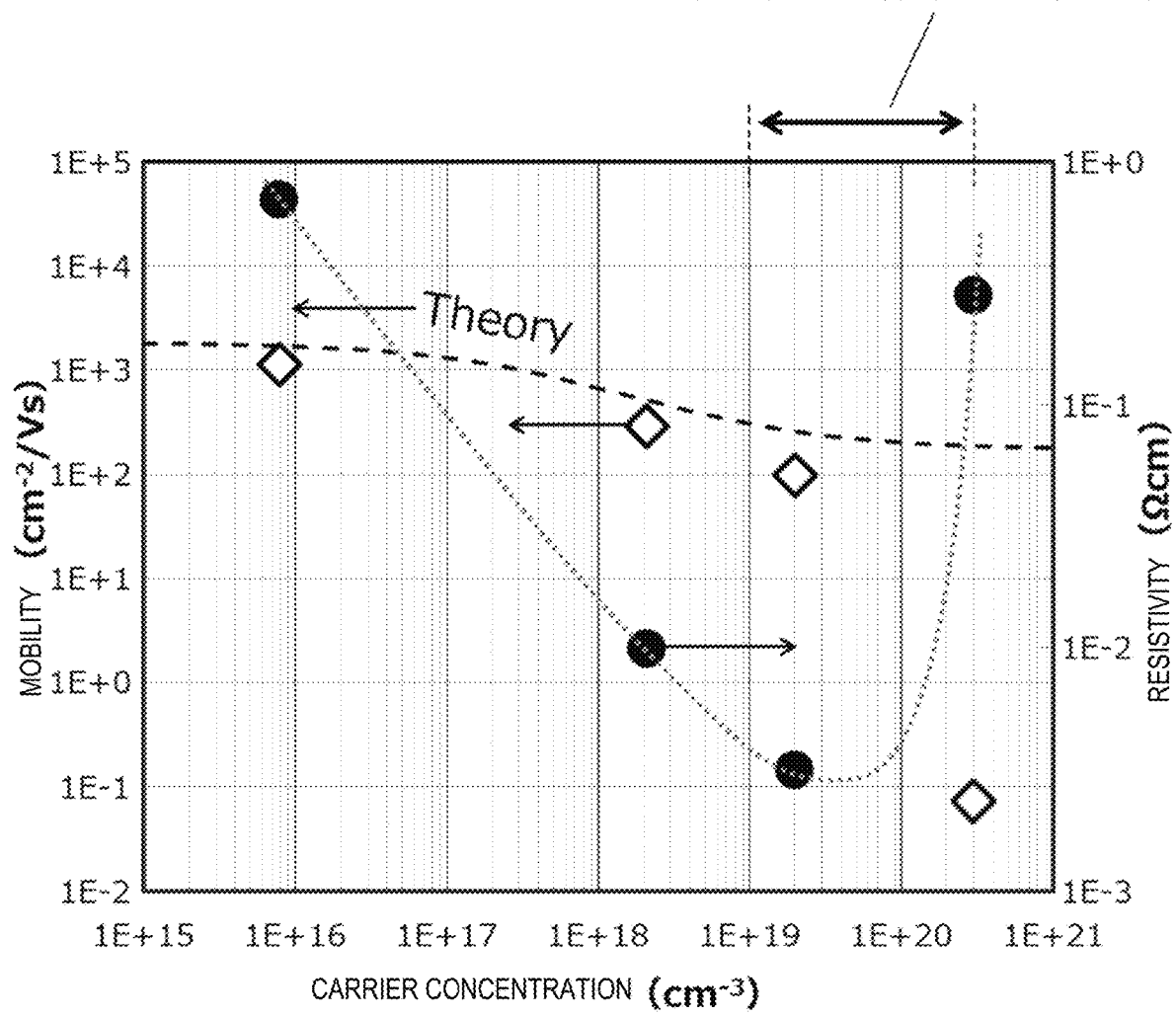
FIG. 4 is a diagram showing relationships among a carrier concentration, mobility and resistivity in an n-type group III nitride semiconductor layer.

FIG. 4 is a diagram showing relationships among a carrier concentration, mobility and resistivity in an n-type group III nitride semiconductor layer. Furthermore, FIG. 4 shows the relationships in a case where oxygen (O) is used as an n-type dopant for the n-type group III nitride semiconductor layer.

In FIG. 4, a measurement value of the resistivity (Ω·cm) of the n-type group III nitride semiconductor layer is plotted by symbol •, and a measurement value of the mobility (cm$^{-2}$/Vs) of the n-type group III nitride semiconductor layer is plotted by symbol ◊. In addition, a graph connecting each plot is shown in FIG. 4.

In general, in the n-type group III nitride semiconductor layer, the resistivity tends to decrease as the carrier concentration increases. However, the mobility significantly decreases when the carrier concentration exceeds a certain level. Therefore, the resistivity of the n-type group III nitride semiconductor layer reaches the minimum value at a specific carrier concentration. In a case where oxygen (O) is used as the n-type dopant, the resistivity has the minimum value at $10^{19}$ cm$^{-3}$ as shown in FIG. 4. However, in a case where the oxygen is doped in a concentration exceeding $3\times10^{20}$ cm$^{-3}$, the mobility is reduced by three columns as compared with a theoretical value (dotted line), which leads to an increase in the resistivity of the n-type group III nitride semiconductor layer. This is because crystal quality is decreased and electron scattering is increased when the amount of the impurity in the n-type group III nitride semiconductor layer is increased.

From this point of view, the resistivity of the first n-type GaN layer 102 can be reduced as much as possible by setting the carrier concentration of the first n-type GaN layer 102 to be at least equal to $1\times10^{19}$ cm$^{-3}$ but less than $3\times10^{20}$ cm$^{-3}$.

On one hand, the carrier concentration of the second n-type group III nitride semiconductor layer 103 is preferably at least equal to $5\times10^{17}$ cm$^{-3}$ but less than $1\times10^{19}$ cm$^{-3}$.

Since the second n-type group III nitride semiconductor layer 103 is required to be grown with a flat surface as described above, it is inevitable to lower the incorporation efficiency of the impurity during the growth of the second n-type group III nitride semiconductor layer 103. Therefore, an upper limit of a doping amount that can be added without decreasing the crystal quality of the second n-type group III nitride semiconductor layer 103 is $1\times10^{19}$ cm$^{-3}$. If the amount of impurities in the second n-type group III nitride semiconductor layer 103 is at least equal to $1\times10^{19}$ cm$^{-3}$, a small pit (hole-shaped recess) is formed in the second n-type group III nitride semiconductor layer 103, which leads to a decrease in crystal quality. Then, the decrease in crystal quality leads to a decrease in mobility and an increase in resistivity. It is not preferable if the doping amount is less than $5\times10^{17}$ cm$^{-3}$, because the resistivity of the second n-type group III nitride semiconductor layer 103 is increased.

From this point of view, by setting the carrier concentration of the second n-type group III nitride semiconductor layer 103 to be at least equal to $5\times10^{17}$ cm$^{-3}$ but less than $1\times10^{19}$ cm$^{-3}$, it is possible to reduce the resistivity of the second n-type group III nitride semiconductor layer 103 while the flatness of the surface of the second n-type group III nitride semiconductor layer 103 is ensured.

On the other hand, the carrier concentration at a position close to the light emitting layer 104 in the second n-type group III nitride semiconductor layer 103 may be decreased. For example, the carrier concentration is set to be at least equal to $5\times10^{17}$ cm$^{-3}$ but less than $1\times10^{19}$ cm$^{-3}$ at a position close to the first n-type group III nitride semiconductor layer 102, and the carrier concentration is set to be at least equal to $5\times10^{17}$ cm$^{-3}$ but less than $5\times10^{18}$ cm$^{-3}$ at the position close to the light emitting layer 104. In addition, the carrier concentration in the second n-type group III nitride semiconductor layer 103 may be gradually decreased from the first n-type group III nitride semiconductor layer 102 toward the light-emitting layer 104. In these cases, the second n-type nitride semiconductor layer 103 has a multilayer structure.

Furthermore, in the above-described steps, the crystal growth steps of the first and second n-type group III nitride semiconductor layers 102 and 103 by the HVPE method, and the crystal growth step of the light emitting layer 104 by the MOCVD method are performed in two separate devices, but the LED structure 100 may be formed by growing once if MO-HVPE equipment including the MO raw material, the Ga raw material, and the HCl gas is prepared.

(Step of Forming Light Emitting Diode Element)

Next, the step of forming a light emitting diode element 200 from the LED structure 100 formed by the above-described method will be described in detail with reference to FIGS. 2, 5 and 6.

Figure 5:
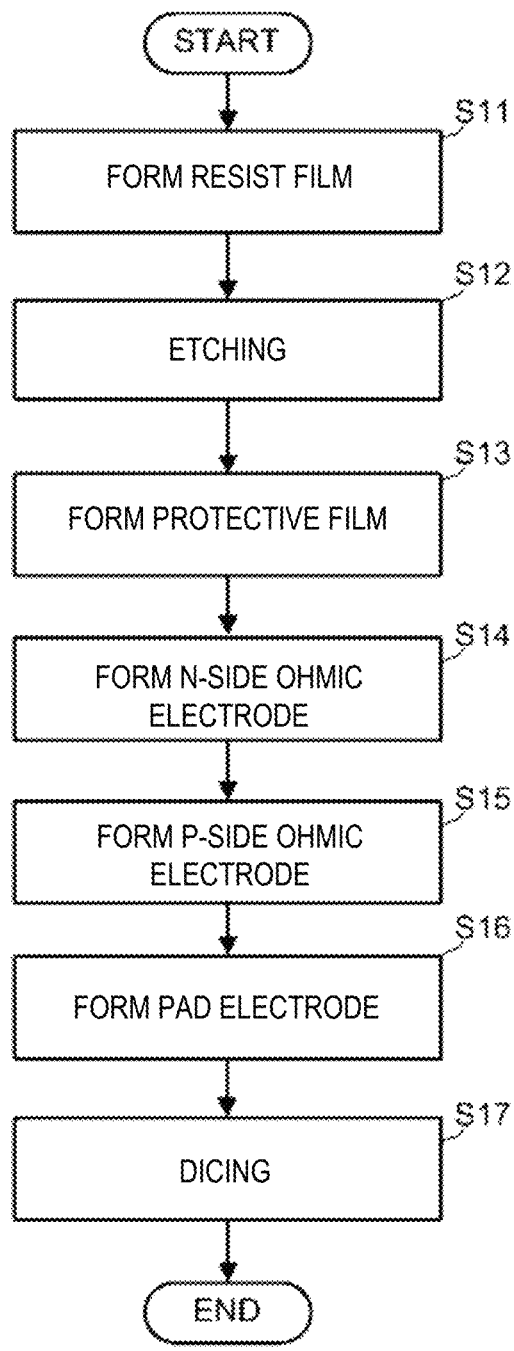
FIG. 5 is a flow chart showing steps of forming the light emitting diode element according to the illustrative embodiment of the disclosure.

FIG. 5 is a flow chart showing steps of forming the light emitting diode element 200.

First, a resist film is formed to cover the p-type GaN layer 105 of the LED structure 100, and only the region where the n-side ohmic electrode 207 is to be formed is exposed by patterning by means of photolithography (step S11).

Next, in a state where only the region where the n-side ohmic electrode 207 is to be formed is exposed, the p-type GaN layer 105, the light emitting layer 104, a part of the second n-type GaN layer 103, and a part of the first n-type GaN layer 102 of the LED structure 100 are removed by dry etching (step S12). Furthermore, the dry etching may adopt ICP dry etching or the like which uses a chlorine-based gas such as $Cl_2$ or $BCl_3$, for example.

Here, the surface on which the n-side ohmic electrode 207 is to be formed is a surface on which both a part of the second n-type GaN layer 103 and a part of the first n-type GaN layer 102 are exposed as shown in FIG. 2. As a result, it is possible to bring the first n-type GaN layer 102 into contact with the n-side ohmic electrode 207 with a high carrier concentration and low resistance. That is, as a result, the total device resistance can be minimized since the thickness of the first n-type GaN layer 102 below the n-side ohmic electrode 207 can be sufficiently ensured while the contact resistance of the n-side ohmic electrode 207 is reduced. In other words, the contact resistance increases to a certain degree if the n-side ohmic electrode 207 is not in contact with the first n-type GaN layer 102. On the other hand, if the engraving is performed only in the first n-type GaN layer 102 completely, since the thickness of the first n-type GaN layer 102 directly below the n-side ohmic electrode 207 is decreased, the resistance is increased.

Furthermore, since the carrier concentration of the first n-type semiconductor layer 102 is about 5 to 10 times of the carrier concentration of the second n-type GaN layer 103, the effect of reducing the resistance of the n-side ohmic electrode 207 can be obtained if the first n-type semiconductor layer 102 is in contact with about half of the total area of the n-side ohmic electrode 207.

In step S12, the engraving amount by dry etching can be confirmed, for example, by observing the etching surface by means of an electron microscope (SEM) or by means of cathode luminescence (CL).

Figure 6:
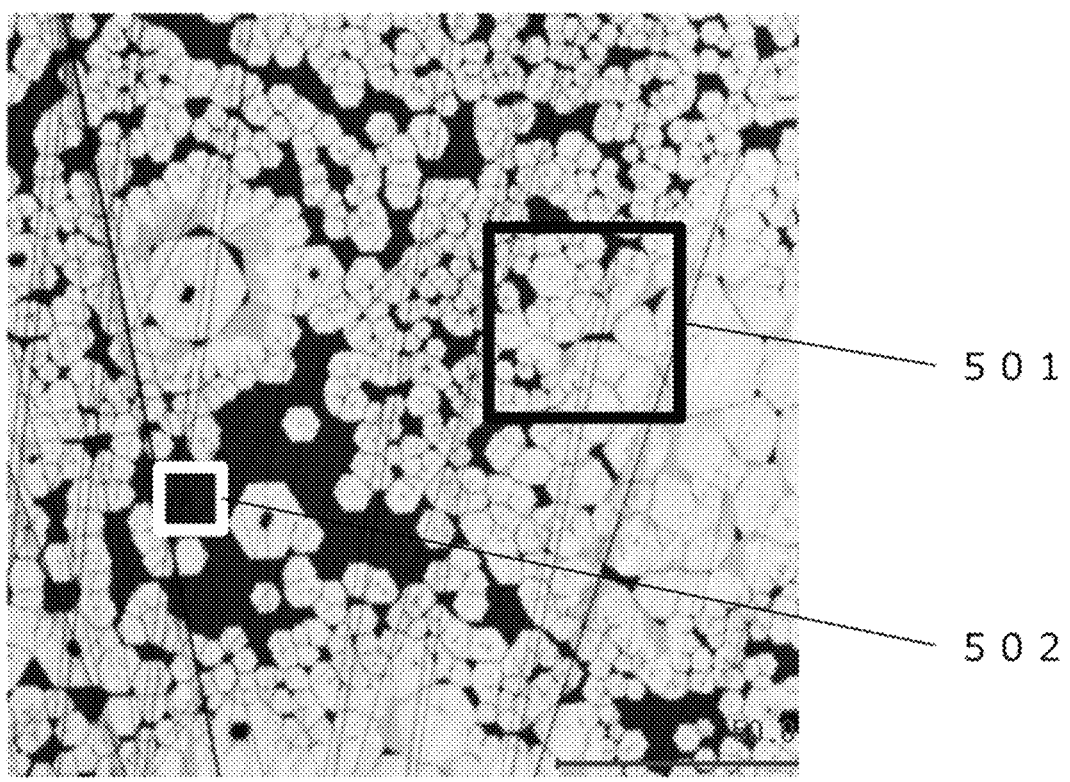
FIG. 6 is a diagram showing an example of an observation result of observing, by a cathode luminescence observation, a surface on which both a second n-type GaN layer and a first n-type GaN layer are exposed.

FIG. 6 is a diagram showing an example of an observation result of observing, by a cathode luminescence observation, a surface on which both the second n-type GaN layer 103 and the first n-type GaN layer 102 are exposed. In the cathode luminescence observation, since a high carrier concentration region 501 is observed as a bright region and the low carrier concentration region 502 is observed as a dark region, the exposed region of the second n-type GaN layer 103 can be distinguished from the exposed region of the first n-type GaN layer 102.

Next, the resist film is removed, and a protective film 206 formed of $SiO_2$ is formed on the entire surface side of the LED structure 100 by plasma CVD (step S13). Furthermore, the protective film 206 may be formed by atmospheric pressure CVD or sputtering film formation. In addition, the thickness of the protective film 206 is preferably about 100 nm to 500 nm, for example, 200 nm, as long as insulation can be sufficiently ensured.

Next, the n-side ohmic electrode 207 is formed on the second n-type GaN layer 103 of the LED structure 100 (step S14). At this time, the protective film 206 is removed by wet etching using a buffered hydrofluoric acid (BHF) solution after the resist film is patterned by photolithography, so as to expose only the region where the n-side ohmic electrode 207 is to be formed, and thus the n-side ohmic electrode 207 formed of Ti/Al/Au is formed on the surface on which a part of the second n-type GaN layer 103 and a part of the first n-type GaN layer 102 are exposed.

Subsequently, a p-side ohmic electrode 208 is formed on the p-type GaN layer 105 of the LED structure 100 (step S15). At this time, similar to the step of forming the n-side ohmic electrode 207, the p-side ohmic electrode 208 formed of Ag/Ti/Au is formed on the p-type GaN layer 105 after the resist film is patterned by photolithography and the protective film 206 is wetly etched by using the buffered hydrofluoric acid solution.

Furthermore, in the case of a flip-chip LED, a material having a high reflectance, for example, a material mainly containing Ag is preferably used as the p-side ohmic electrode 208. However, since there are problems in heat resistance and corrosion resistance in a case of using Ag alone, an Ag alloy to which a trace amount of additives are added may be used.

Next, a pad electrode 209 is formed, by Au plating, on the n-side ohmic electrode 207 and the p-side ohmic electrode 208 (step S16). The thickness of the Au plating is preferably at least equal to 10 μm but no greater than 100 μm, and is 30 μm in this illustrative embodiment.

Next, the obtained LED structure is divided into individual LED chips by blade dicing (step S17). Then, the LED chip is mounted on the sub-mount substrate 211 such that the pad electrode 209 is connected to the sub-mount side electrode 210.

In this manner, the flip-chip light emitting diode element 200 is manufactured.

[Effect]

As described above, the flip-chip light emitting diode element 200 according to the present illustrative embodiment includes the stacked body structure (LED structure) 100 configured by sequentially stacking the first n-type group III nitride semiconductor layer 102 having a carrier concentration at least equal to $1 \times 10^{19}$ $cm^{-3}$ but less than $3 \times 10^{20}$ $cm^{-3}$, the second n-type group III nitride semiconductor layer 103 having a carrier concentration at least equal to $5 \times 10^{17}$ $cm^{-3}$ but less than $1 \times 10^{19}$ $cm^{-3}$, the light-emitting layer 104 formed by a group III nitride semiconductor, and the p-type group III nitride semiconductor layer 105. The height of unevenness of the interface between the first n-type group III nitride semiconductor layer 102 and the second n-type group III nitride semiconductor layer 103 is greater than that of unevenness of the interface between the second n-type group III nitride semiconductor layer 103 and the light emitting layer 104.

Therefore, according to the light emitting diode element 200 of the present illustrative embodiment, the thickness of an n-type semiconductor layer can be increased to 5 times or more and the resistivity of the n-type semiconductor layer can be reduced to 1/10 or less compared with those of the light emitting diode element according to the related art without deteriorating the quality of the light emitting layer 104. Accordingly, a series resistance component (that is, lateral resistance) caused by the n-type semiconductor layer is reduced to 1/50 or less compared with that of the light-emitting diode element according to the related art while good emission characteristics are achieved.

Figure 7:
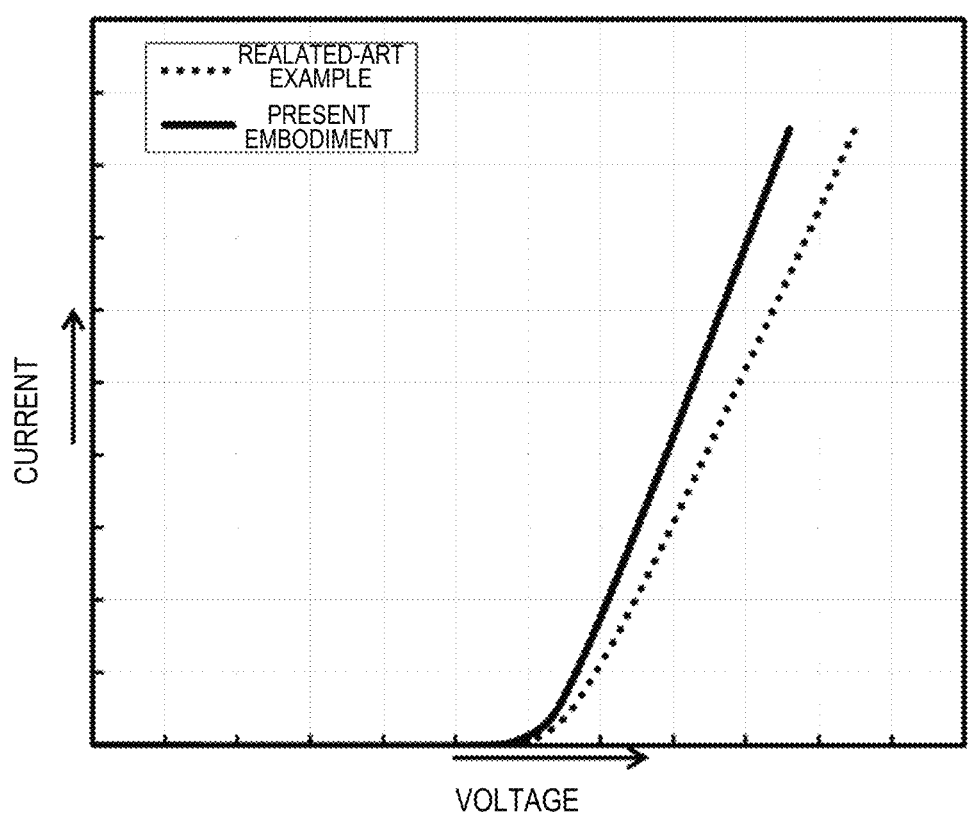
FIG. 7 is a diagram showing a current-voltage characteristic of the light emitting diode element according to the illustrative embodiment of the disclosure.

FIG. 7 is a diagram showing a current-voltage characteristic of the light emitting diode element 200 according to the present illustrative embodiment.

As can be seen from FIG. 7, in the light emitting diode element 200 according to the present illustrative embodiment, the operating voltage at a constant current is lower than that of the light emitting diode element according to the related art. In other words, according to the light emitting diode element 200 of the present illustrative embodiment, a more efficient LED can be achieved.

In addition, according to the light emitting diode element 200 of the present illustrative embodiment, an LED can be formed by using a heterogeneous substrate, which contributes to reduce the cost.

(First Modification)

Figure 8:
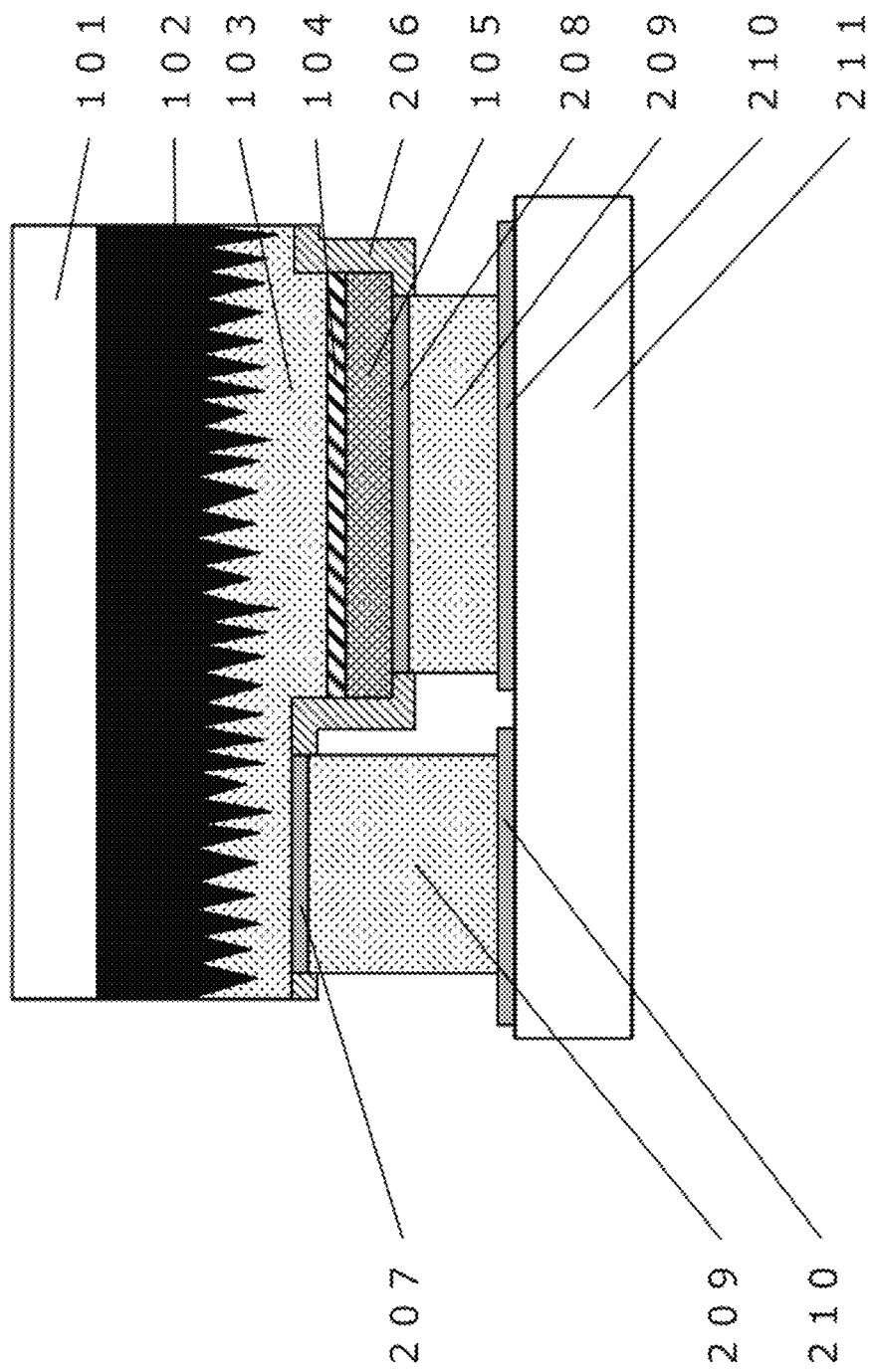
FIG. 8 is a diagram showing a configuration of a light emitting diode element according to a first modification of the disclosure.

FIG. 8 is a diagram showing a configuration of a light emitting diode element 200 according to a first modification.

The light emitting diode element 200 according to the first modification is different from that according to the above-described illustrative embodiment in that a surface on which the n-side ohmic electrode 207 is to be formed is a surface on which only the second n-type GaN layer 103 is exposed.

In FIG. 8, the engraving by using dry etching in the etching step (step S12) is reduced and the surface on which the n-side ohmic electrode 207 is to be formed is in the second n-type GaN layer 103. Such a structure may be adopted in a case where the level difference in engraving by using dry etching is desired to be reduced, for example.

In the light emitting diode element 200 according to the present modification, the resistance can be reduced by increasing the thickness of the n-type semiconductor layer. However, on the other hand, the contact resistance of the n-side ohmic electrode 207 tends to be higher in a certain degree. Therefore, in the case of the structure of the first modification, it is preferable to set the carrier concentration of the second n-type GaN layer 103 as high as possible, for example, as close as possible to $1 \times 10^{19}$ cm$^{-3}$.

(Second Modification)

Figure 9:
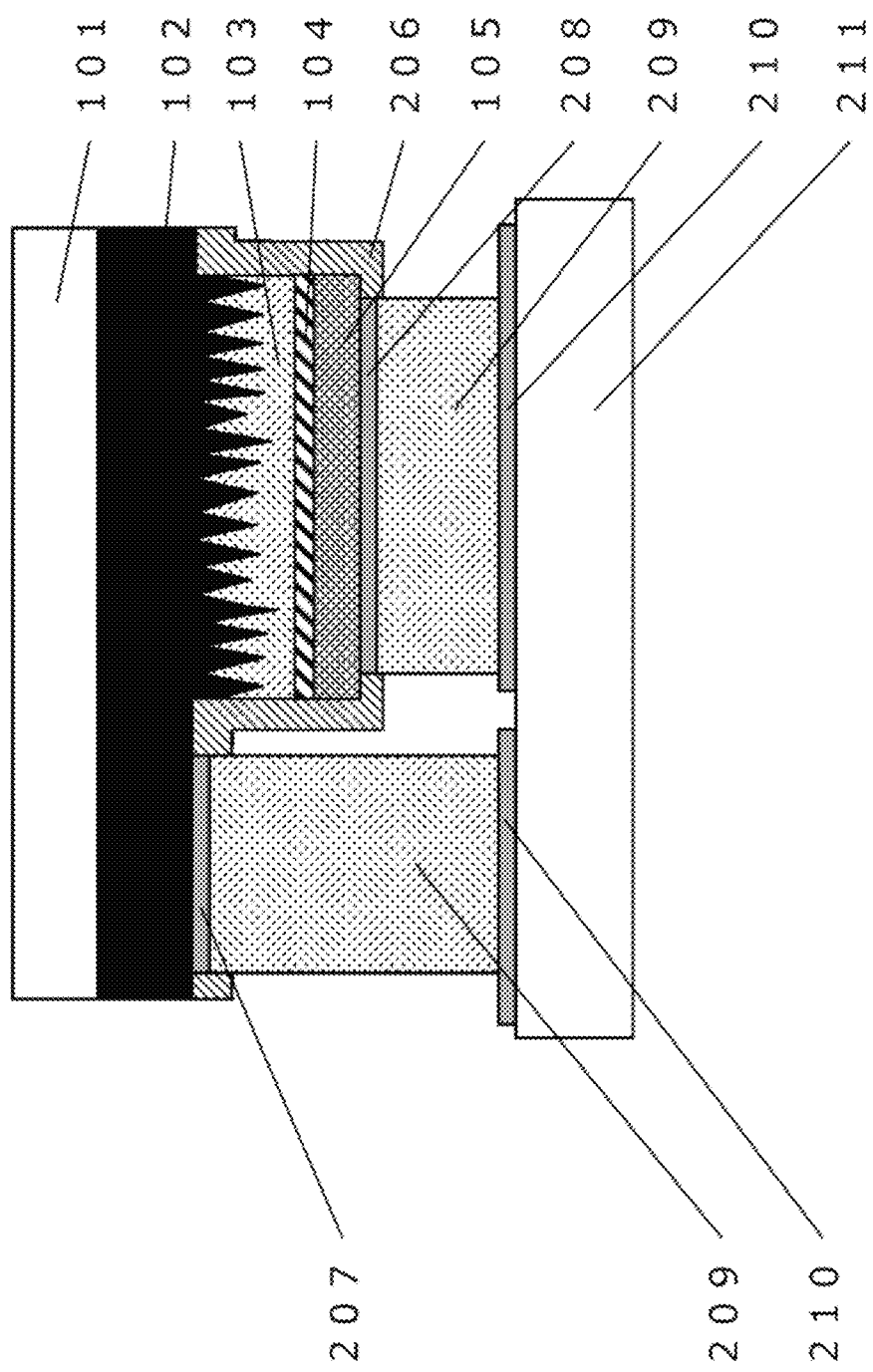
FIG. 9 is a diagram showing a configuration of a light emitting diode element according to a second modification of the disclosure.

FIG. 9 is a diagram showing a structure of a light emitting diode element 200 according to a second modification.

The light emitting diode element 200 according to the second modification is different from that according to the above-described illustrative embodiment in that a surface on which the n-side ohmic electrode 207 is to be formed is a surface on which only the first n-type GaN layer 102 is exposed.

In FIG. 9, the surface on which the n-side ohmic electrode 207 is to be formed is in the first n-type GaN layer 102. The process step can be simplified by adopting such a structure in a case where the thickness of the first n-type GaN layer 102 is sufficiently large or the etching is difficult to be stopped at the interface with small unevenness, for example.

In the light emitting diode element 200 according to the present modification, the contact resistance of the n-side ohmic electrode 207 can be minimized. However, on the other hand, the substrate resistance generated by the first n-type GaN layer 102 directly below the n-side ohmic electrode 207 is increased in a certain degree since the layer thickness is decreased. Therefore, in the case of the configuration of the second modification, it is desirable to set the thickness of the first n-type GaN layer 102 as thick as possible, for example, to 100 μm because increase in resistance due to decrease in thickness can be minimized.

(Third Modification)

The above-described illustrative embodiment showed a mode in which the second n-type GaN layer 103 is formed by a single crystal growth process. However, in a case where unevenness of the first n-type GaN layer 102 is very large, it is difficult to completely flatten the surface of the second n-type GaN layer 103, and thus unevenness of about several hundreds of nm may remain after the second n-type GaN layer 103 is formed. In addition, the thickness of the second n-type GaN layer 103 may be too thick for achieving the flattening.

Therefore, mechanical polishing or Chemical Mechanical Polishing (CMP) may be implemented on the second n-type GaN layer 103 when forming the second n-type GaN layer 103. For example, after the second n-type GaN layer 103 is subjected to the crystal growth by the HVPE method, the second n-type GaN layer 103 may be subjected to mechanical polishing and then to the crystal growth again by the MOCVD method or the like.

With such structure, unevenness formed on the surface of the first n-type semiconductor layer 102 can be reduced. In other words, since the crystal quality of the light emitting layer 104 can be improved, the light emitting characteristics of the light emitting layer 104 can be improved.

While specific examples of the disclosure have been described in detail, these are merely examples and do not limit the scope of the claims. The technology described in the claims includes various modifications and changes to the specific examples illustrated above.

According to the light-emitting diode element of the disclosure, the lateral resistance can be greatly reduced and a more efficient LED with a low operating voltage can be achieved.

Although the present disclosure has been described with reference to the aforementioned embodiments and methods, this description is not meant to be construed in a limiting sense. Various modifications of the disclosed embodiments and methods as well as alternative embodiments and methods will become apparent to persons skilled in the art. It is therefore contemplated that the appended claims will cover any such modifications.

What is claimed is:

1. A light emitting diode element of a flip-chip type, comprising:
    a stacked body structure configured by stacking following layers sequentially:
        a first n-type group III nitride semiconductor layer having a carrier concentration that is at least $1 \times 10^{19}$ cm$^{-3}$ but less than $3 \times 10^{20}$ cm$^{-3}$;
        a second n-type group III nitride semiconductor layer having a carrier concentration that is at least $5 \times 10^{17}$ cm$^{-3}$ but less than $1 \times 10^{19}$ cm$^{-3}$;
        a light-emitting layer formed by a group III nitride semiconductor; and
        a p-type group III nitride semiconductor layer, wherein:
    an upper face of the first n-type group III nitride semiconductor layer facing the second n-type group III nitride semiconductor layer is uneven,
    an upper surface of the second n-type group III nitride semiconductor layer facing the light emitting layer is uneven, and
    a height of unevenness of the upper surface of first n-type group III nitride semiconductor layer is greater than a height of unevenness of the upper surface of the second n-type group III nitride semiconductor layer.

2. The light emitting diode element according to claim 1, wherein the height of unevenness of the upper surface of the first n-type group III nitride semiconductor layer is at least 1 μm but no greater than 10 μm.

3. The light emitting diode element according to claim 1, wherein the stacked body structure is formed on an insulation substrate transparent to an emission wavelength of the light emitting layer.

4. The light emitting diode element according to claim 3, wherein the insulation substrate is formed of one selected from a following group: sapphire, SiC, ZnO, Ga2O$_3$, and ScAlMgO$_4$.

5. The light emitting diode element according to claim 1, further comprising:
- an n-side ohmic electrode in ohmic contact with at least one of the first n-type group III nitride semiconductor layer and the second n-type group III nitride semiconductor layer; and
- a p-side ohmic electrode in ohmic contact with the p-type group III nitride semiconductor layer,
- wherein the n-side ohmic electrode and the p-side ohmic electrode are disposed on a same side of the stacked body structure.

6. The light emitting diode element according to claim 5,
- wherein a contact surface between the n-side ohmic electrode and the stacked body structure is located in a region of [[the]] an interface between the first n-type group III nitride semiconductor layer and the second n-type group III nitride semiconductor layer, and
- wherein the n-side ohmic electrode is in ohmic contact with both of the first n-type group III nitride semiconductor layer and the second n-type group III nitride semiconductor layer.

7. The light emitting diode element according to claim 1, wherein a donor impurity of the first n-type group III nitride semiconductor layer is oxygen.

8. The light emitting diode element according to claim 1, wherein an average thickness of the first n-type group III nitride semiconductor layer is at least 10 μm but no greater than 100 μm.

9. A method for manufacturing a light emitting diode element of a flip-chip type, the method comprising:
- forming a first n-type group III nitride semiconductor layer on an under-substrate, under a condition in which facet growth is generated preferentially, such that a carrier concentration is at least $1 \times 10^{19}$ cm$^{-1}$ but less than $3 \times 10^{20}$ cm$^{-3}$;
- forming a second n-type group III nitride semiconductor layer on the first n-type group III nitride semiconductor layer, such that a carrier concentration is at least $5 \times 10^{17}$ cm$^{-3}$ but less than $1 \times 10^{19}$ cm$^{-3}$;
- forming a light emitting layer configured by a group III nitride semiconductor on the second n-type group III nitride semiconductor layer; and
- forming a p-type group III nitride semiconductor layer on the light emitting layer, wherein:
- an upper surface of the second n-type group III nitride semiconductor layer facing the light emitting layer is uneven,
- an upper face of the first n-type group III nitride semiconductor layer facing the second n-type group III nitride semiconductor layer is uneven, and
- a height of unevenness of the upper surface of the first n-type group III nitride semiconductor layer is greater than a height of unevenness of the upper surface of the second n-type group III nitride semiconductor layer.

10. The method for manufacturing a light emitting diode element of a flip-chip type according to claim 9, wherein the height of unevenness of the upper surface of the first n-type group III nitride semiconductor layer is formed to be at least 1 μm but no greater than 10 μm.

11. A light emitting diode element of a flip-chip type comprising:
- a stacked body structure configured by stacking following layers sequentially:
- a first n-type group III nitride semiconductor layer having a carrier concentration that is at least $1 \times 10^{19}$ cm$^{-3}$ but less than $3 \times 10^{20}$ cm$^{-3}$;
- a second n-type group III nitride semiconductor layer having a carrier concentration that is at least $5 \times 10^{17}$ cm$^{-3}$ but less than $1 \times 10^{19}$ cm$^{-3}$;
- a light-emitting layer formed by a group III nitride semiconductor; and
- a p-type group III nitride semiconductor layer;
- an n-side ohmic electrode in ohmic contact with at least one of the first n-type group III nitride semiconductor layer and the second n-type group III nitride semiconductor layer;
- a p-side ohmic electrode in ohmic contact with the p-type group III nitride semiconductor layer, wherein:
- a height of unevenness on an interface between the first n-type group III nitride semiconductor layer and the second n-type group III nitride semiconductor layer is greater than a height of unevenness on an interface between the second n-type group III nitride semiconductor layer and the light emitting layer;
- the n-side ohmic electrode and the p-side ohmic electrode are disposed on a same side of the stacked body structure,
- a contact surface between the n-side ohmic electrode and the stacked body structure is located in a region of the interface between the first n-type group III nitride semiconductor layer and the second n-type group III nitride semiconductor layer, and
- the n-side ohmic electrode is in ohmic contact with both of the first n-type group III nitride semiconductor layer and the second n-type group III nitride semiconductor layer.

* * * * *